United States Patent [19]

Feddeler et al.

[11] Patent Number: 5,323,066
[45] Date of Patent: Jun. 21, 1994

[54] METHOD AND APPARATUS FOR PERFORMING POWER ON RESET INITIALIZATION IN A DATA PROCESSING SYSTEM

[75] Inventors: James R. Feddeler; Gregory A. Racino, both of Austin, Tex.

[73] Assignee: Motorola, Inc., Schaumburg, Ill.

[21] Appl. No.: 891,066

[22] Filed: Jun. 1, 1992

[51] Int. Cl.⁵ .............................................. H03K 3/01
[52] U.S. Cl. .............................. 307/272.3; 307/296.1; 307/296.6; 365/226
[58] Field of Search .............. 307/296.1, 296.6, 296.7, 307/296.8, 272.1, 272.3, 594; 365/226

[56] References Cited

U.S. PATENT DOCUMENTS

| | | | |
|---|---|---|---|
| 4,103,187 | 7/1978 | Imamura | 307/272.3 |
| 4,818,904 | 4/1989 | Kobayashi | 307/594 |
| 4,900,950 | 2/1990 | Dubujet | 307/272.3 |
| 4,933,902 | 6/1990 | Yamada et al. | 365/226 |
| 4,940,909 | 6/1990 | Mulder et al. | 307/272.3 |
| 5,115,146 | 5/1992 | McClure | 307/272.3 |
| 5,136,181 | 8/1992 | Yukawa | 307/272.3 |
| 5,140,178 | 8/1992 | Yoshihara et al. | 307/272.3 |
| 5,151,614 | 9/1992 | Yamazaki et al. | 307/272.3 |

*Primary Examiner*—Timothy P. Callahan
*Assistant Examiner*—Trong Phan
*Attorney, Agent, or Firm*—Susan C. Hill

[57] ABSTRACT

A method and apparatus for performing power on reset initialization in a data processing system (40). In one form, the present invention uses a circuit (71) to ensure that a node (65) always power up to the correct logic level. This node (65) can then be used to initialize a latch (83) so that the latch (83) always drives a predetermined logic level at its data output when the latch (83) powers up. The data output of latch (83) is a Power On Reset signal which is asserted during power on reset initialization and which is negated when power on reset initialization is completed.

20 Claims, 5 Drawing Sheets

FIG. 1 -PRIOR ARTdd
METHOD AND APPARATUS FOR PERFORMING POWER ON RESET INITIALIZATION IN A DATA PROCESSING SYSTEM

FIELD OF THE INVENTION

The present invention relates in general to data processors, and more particularly to performing power on reset initialization in a data processing system.

BACKGROUND OF THE INVENTION

Many of today's microcontroller integrated circuits have a "power on reset (POR)" feature. The purpose of this power on reset feature is to ensure that the circuits in a microcontroller are initialized to a known state each time a positive power supply voltage is applied to the power integrated circuit pin or pins of the microcontroller. The term "positive power supply voltage" as used in this document refers to a power supply voltage which is positive with respect to ground.

The power on reset feature can also be used to control the initialization of a crystal oscillator. In most applications utilizing a microcontroller, a crystal oscillator and its associated logic are commonly used to generate clocks signals. These clock signals are then used to clock various circuits in a microcontroller. One way the power on reset feature achieves the desired initialization is to ensure that the crystal oscillator receives an adequate amount of time to start and stabilize before the generated clocks signals are used to clock various circuits in the microcontroller. Thus the power on reset feature can be used to ensure that the clock signals are sufficiently stable before they are used.

A "power on detection" circuit is utilized in some microcontrollers as part of the implementation of the power on reset feature. The power on detection circuit is a circuit which is used to detect a "power on condition". A "power on condition" occurs when a positive power supply voltage is applied to one or more power integrated circuit pins of the microcontroller.

Some prior art power on detection circuits have serious drawbacks. For example, some circuits are unable to detect a power on condition when the rise time of the positive power supply voltage is very slow. Also, some power on detection circuits draw too much DC current. In addition, some power on detection circuits require the use of a large resistor, which may require a significant amount of semiconductor area.

SUMMARY OF THE INVENTION

The previously mentioned needs are fulfilled and other advantages achieved with the present invention. In one form, the present invention is an apparatus and a method for ensuring that a first node always powers up to a predetermined logic level.

In one embodiment, the apparatus is a circuit which has a first capacitive means for storing charge. The first capacitive means has a first electrode coupled to the first node and has a second electrode. The circuit also has a second capacitive means for storing charge. The second capacitive means has a first electrode coupled to a second node and has a second electrode. In addition, the circuit has a first inverting logic gate. The first inverting logic gate has a first input coupled to the first node and an output coupled to the second node. The circuit also has a second inverting logic gate. The second inverting logic gate has a first input coupled to the second node and an output coupled to the first node.

The present invention will be understood by one skilled in the art from the detailed description below in conjunction with the accompanying drawings.

DESCRIPTION OF THE PREFERRED EMBODIMENT

The terms "assert" and "negate" will be used when referring to the rendering of a signal, status bit, or similar apparatus into its logically true or logically false state, respectively. "Active" is used to describe a signal, status bit, or similar apparatus that has been asserted. "Non-active" is used to describe a signal, status bit, or similar apparatus that has been negated.

Figure 1:
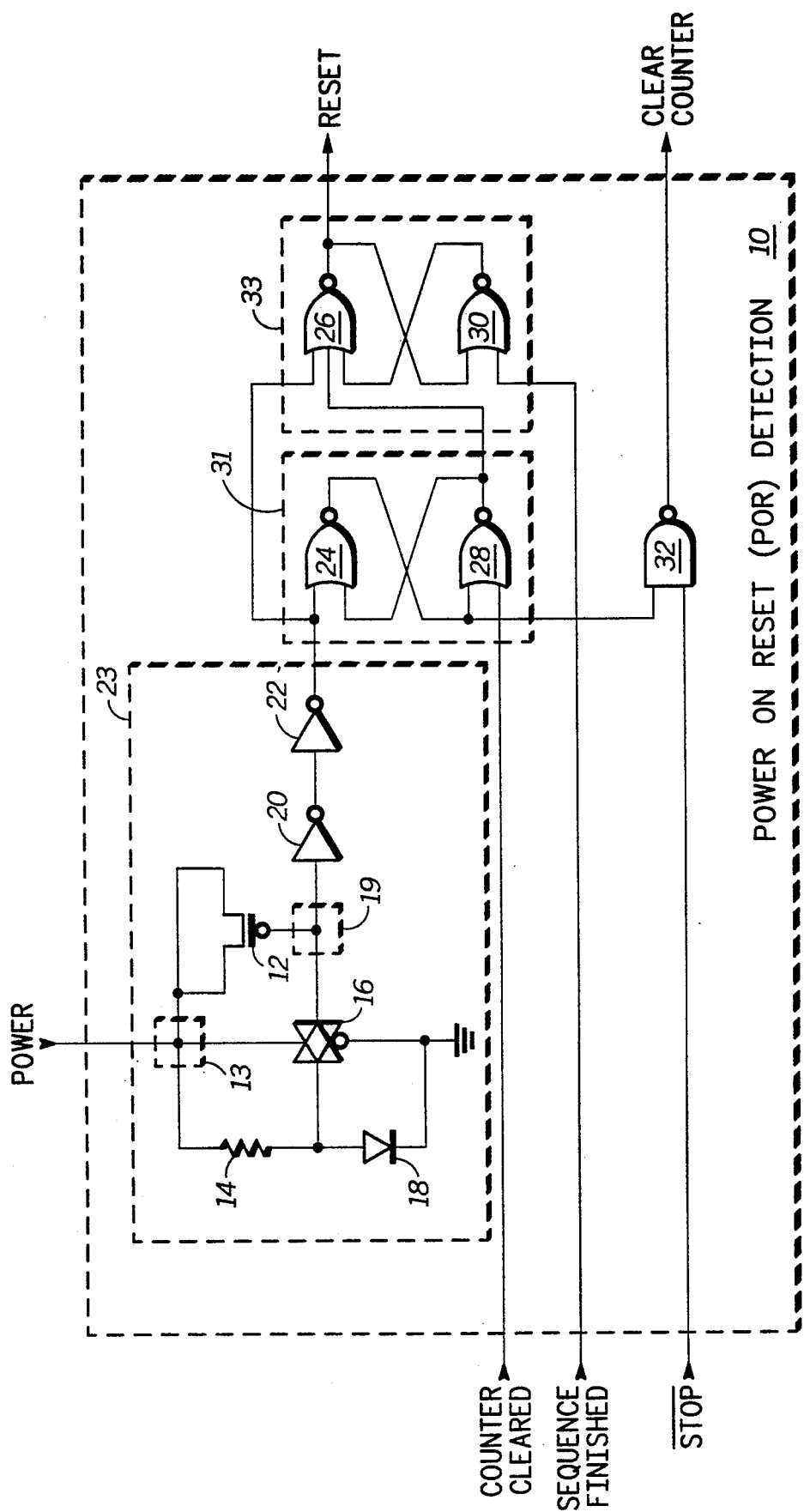
FIG. 1 illustrates, in partial logic diagram form and partial schematic diagram form, a prior art power on reset (POR) detection circuit 10.

FIG. 1 illustrates a prior art power on reset (POR) detection circuit 10. The prior art POR detection circuit 10 receives a positive power supply voltage labeled "Power", a Counter Cleared signal, a Sequence Finished signal, and a STOP signal as inputs. The prior art POR detection circuit 10 generates a Reset signal and a Clear Counter signal as outputs. A transistor 12 is a p-channel MOSFET that has both a first current electrode and a second current electrode connected to "Power" at node 13. Node 13 is also connected to a first terminal of resistor 14 and to an n-channel portion of a transmission gate 16.

The second terminal of resistor 14 is connected to a positive terminal of diode 18 and to the input of transmission gate 16. The negative terminal of diode 18 and the p-channel portion of transmission gate 16 are both connected to ground. The output of transmission gate 16 is connected to the control electrode of transistor 12 and to the input of inverter 20. The output of inverter 20 is connected to the input of inverter 22.

The output of inverter 22 is connected to an input of NOR gate 24 and to an input of NOR gate 26. The output of NOR gate 24 and the Counter Cleared signal are both inputs to NOR gate 28. The output of NOR gate 28 is an input to NOR gate 24 and an input to NOR gate 26. The output of NOR gate 26 and the Sequence Finished signal are both inputs to NOR gate 30. The output of NOR gate 30 is an input to NOR gate 26. The output of NOR gate 26 is a signal labeled Reset. The output of NOR gate 24 and the STOP signal are both inputs to NAND gate 32. The output of NAND gate 32 is a signal labeled Clear Counter.

Figure 2:
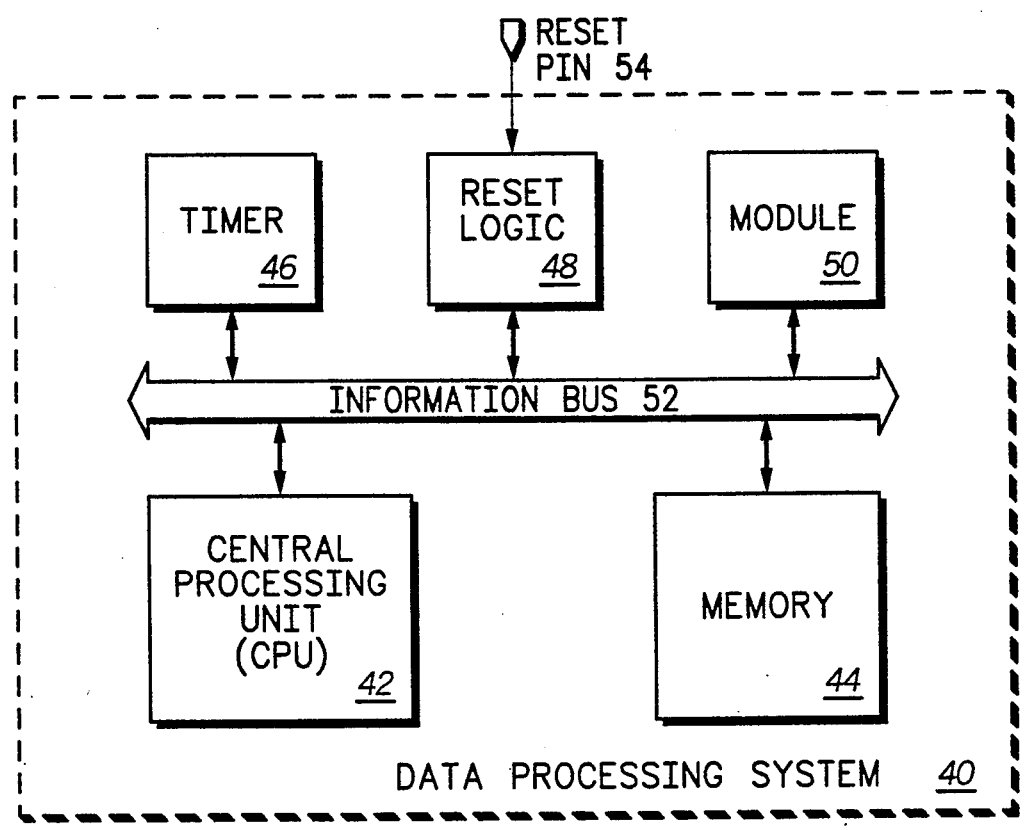
FIG. 2 illustrates, in block diagram form, a data processing system 40 in accordance with one embodiment of the present invention.

FIG. 2 illustrates one embodiment of the present invention. FIG. 2 illustrates a data processing system 40 having a central processing unit (CPU) 42, a memory 44, a timer 46, a reset logic circuit 48, and a module 50 which are all bi-directionally coupled to an information bus 52. In other embodiments of the present invention, memory 44 may or may not be present and timer 46 may or may not be present.

Module 50 is an additional block of circuitry that performs a specific desired function such as, for example, serial communications or analog to digital conversions. In other embodiments of the present invention, module 50 may or may not be present. Reset logic 48 receives an input signal from an integrated circuit pin labeled reset pin 54. Note that in different embodiments of the present invention, all, some, or none of the signals included in information bus 52 may be transferred external to data processing system 40.

Figure 3:
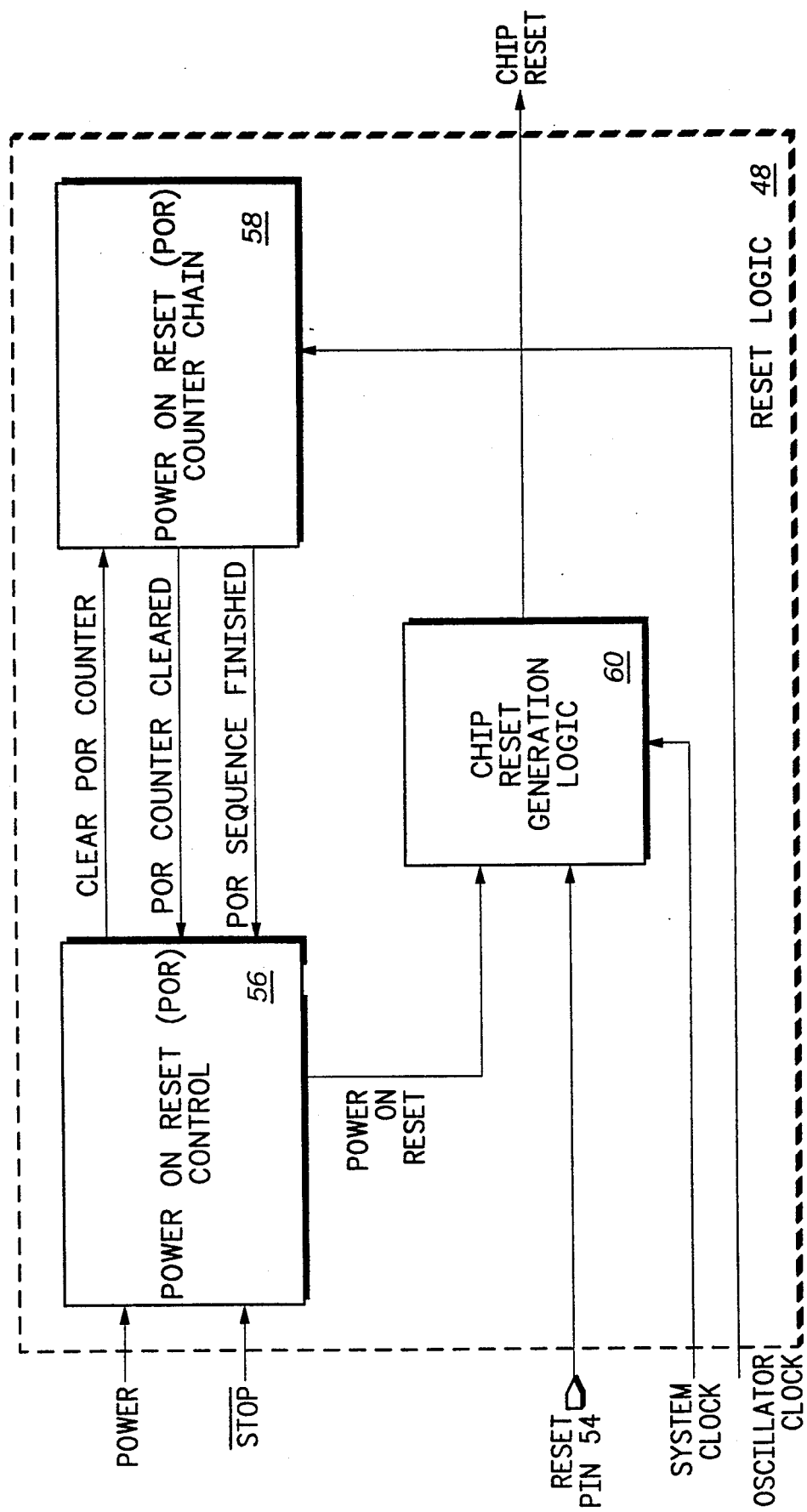
FIG. 3 illustrates, in block diagram form, a reset logic circuit 48 of FIG. 2 in accordance with one embodiment of the present invention.

FIG. 3 illustrates one implementation of the reset logic 48 of FIG. 2. A power on reset (POR) control circuit 56 receives a positive power supply voltage labeled "Power", a STOP signal, a POR Counter Cleared signal, and a POR Sequence Finished signal as inputs. Note that in some embodiments of the present invention, POR control 56 may receive "Power" directly from one or more integrated circuit pins (not shown). The POR control 56 provides a Clear POR Counter signal and a Power On Reset signal as outputs.

A power on reset (POR) counter chain circuit 58 receives the Clear POR Counter signal and an Oscillator Clock signal as inputs. The POR counter chain 58 provides the POR Counter Cleared signal and the POR Sequence Finished signal as outputs.

A chip reset generation logic circuit 60 receives the Power On Reset signal, a signal from reset pin 54, and a system clock signal as inputs. Chip reset generation logic 60 provides a Chip Reset signal as an output.

Figure 4:
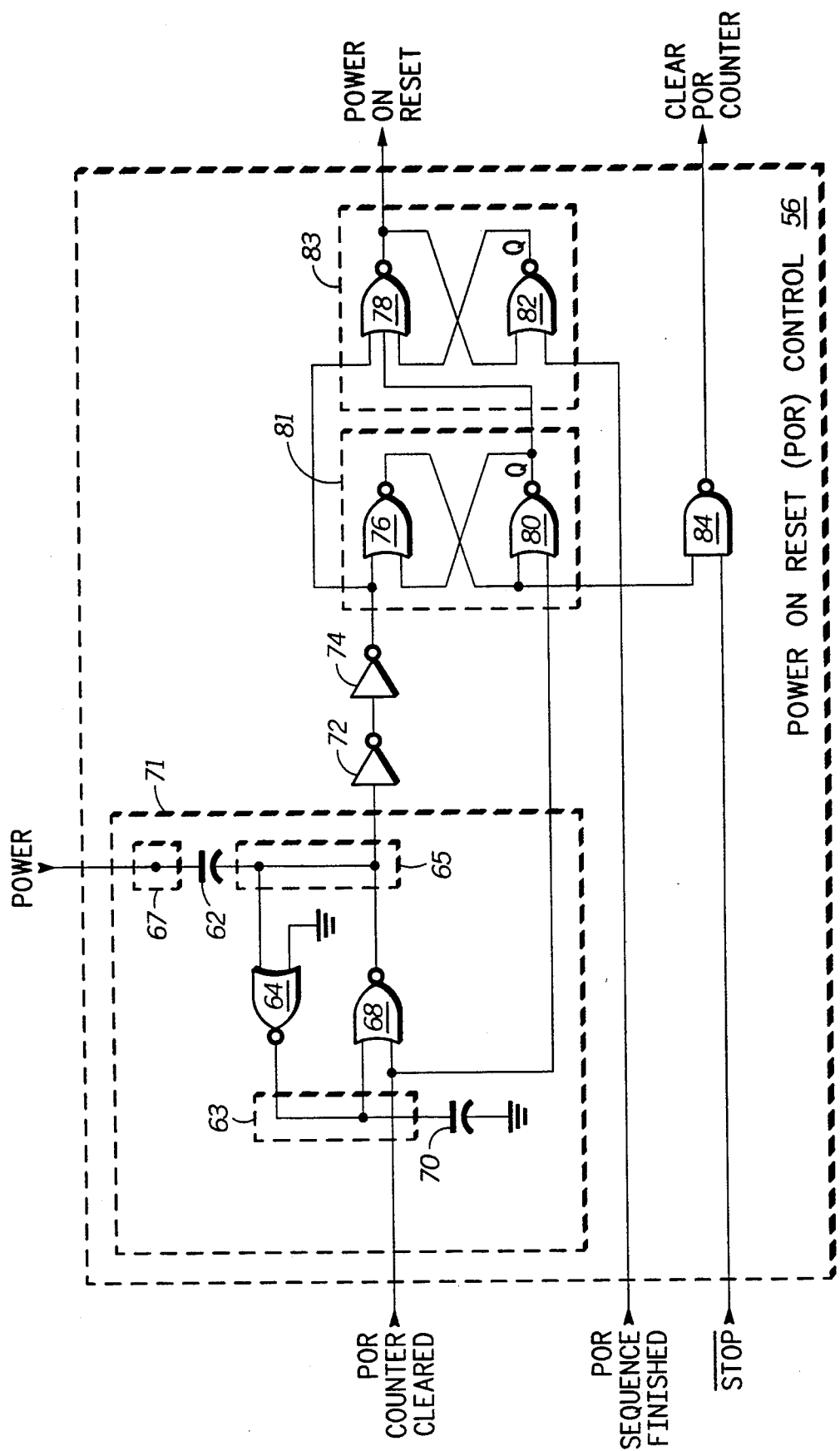
FIG. 4 illustrates, in partial logic diagram form and partial schematic diagram form, a power on reset (POR) control circuit 56 of FIG. 3 in accordance with one embodiment of the present invention.

FIG. 4 illustrates a power on reset (POR) control circuit 56. A first electrode of capacitor 62 is connected to a positive power supply voltage labeled "Power" at node 67. The second electrode of capacitor 62 is connected to an input of NOR gate 64. The other input of NOR gate 64 is connected to ground. The output of NOR gate 64 is connected to an input of NOR gate 68, and to a first electrode of capacitor 70.

In one embodiment of the present invention, an inverter (not shown) was included as part of circuit 71 and 71'. The input of the inverter was coupled to the output of NOR gate 64 and the output of the inverter was not connected to any other circuitry. Although the inverter was included in one embodiment of the present invention, the inverter was not necessary and may be removed in order to conserve semiconductor area.

The second electrode of capacitor 70 is connected to ground. NOR gate 68 also receives a POR Counter Cleared signal as an input. The output of NOR gate 68 is connected to the second electrode of capacitor 62 and to the input of inverter 72. The output of inverter 72 is connected to the input of inverter 74. The output of inverter 74 is connected to an input of NOR gate 76 and to an input of NOR gate 78. The output of NOR gate 76 and the POR Counter Cleared signal are both inputs to NOR gate 80. The output of NOR gate 80 is an input to NOR gate 76 and an input to NOR gate 78.

The output of NOR gate 78 and the POR Sequence Finished signal are both inputs to NOR gate 82. The output of NOR gate 82 is an input to NOR gate 78. The output of NOR gate 78 is a signal labeled Power On Reset. The output of NOR gate 76 and the STOP signal are both inputs to NAND gate 84. The output of NAND gate 84 is a signal labeled Clear PC)R Counter. NOR gates 76 and 80 comprise a cross-coupled set-reset NOR latch 81 with one set input and one reset input. The data output "Q" of SR-latch 81 is the output of NOR gate 80. NOR gates 78 and 82 comprise a cross-coupled set-reset NOR latch 83 with two set inputs and one reset input. The data output "Q" of SR-latch 83 is the output of NOR gate 82.

Figure 5:
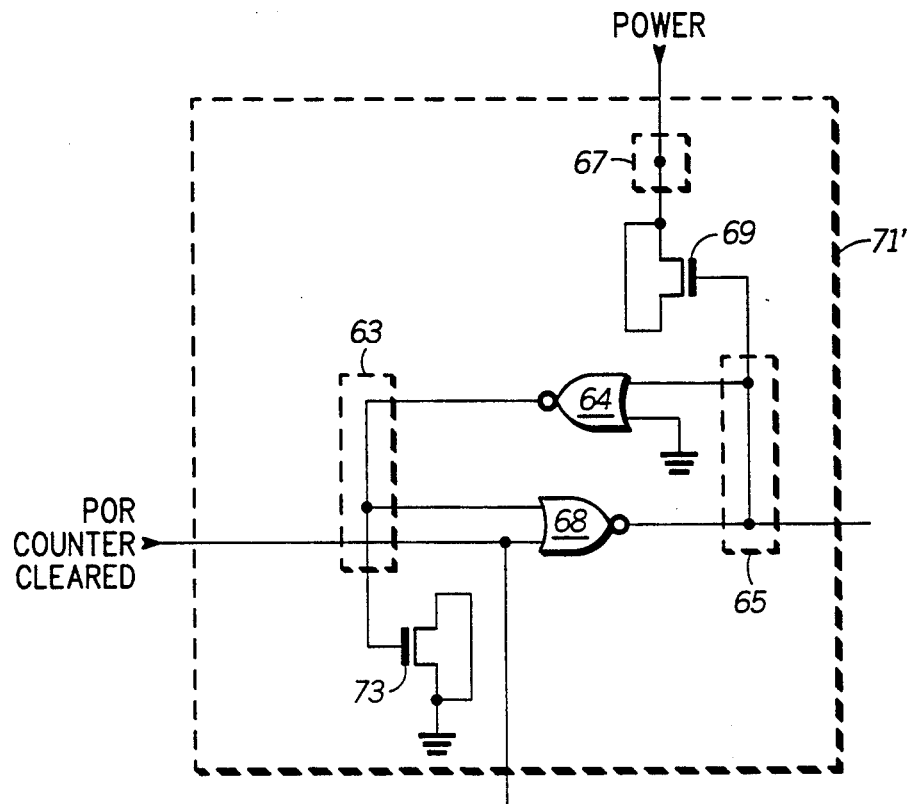
FIG. 5 illustrates, in partial logic diagram form and partial schematic diagram form, a circuit 71' of FIG. 4 in accordance with one embodiment of the present invention.

FIG. 5 illustrates a circuit 71', which is a different embodiment of circuit 71 of FIG. 4. Circuit 71' differs from circuit 71 in the following manner. In circuit 71', capacitor 62 is replaced by an insulated gate field effect transistor 69, and capacitor 70 is replaced by an insulated gate field effect transistor 73. Transistors 69 and 73 may be any combination of n-channel depletion mode transistors, p-channel depletion mode transistors, n-channel enhancement mode transistors, and p-channel enhancement mode transistors. In all other respects, circuit 71' is the same as circuit 71. In circuit 71', transistors 69 and 73 each still serve the function of a capacitor.

Figure 6:
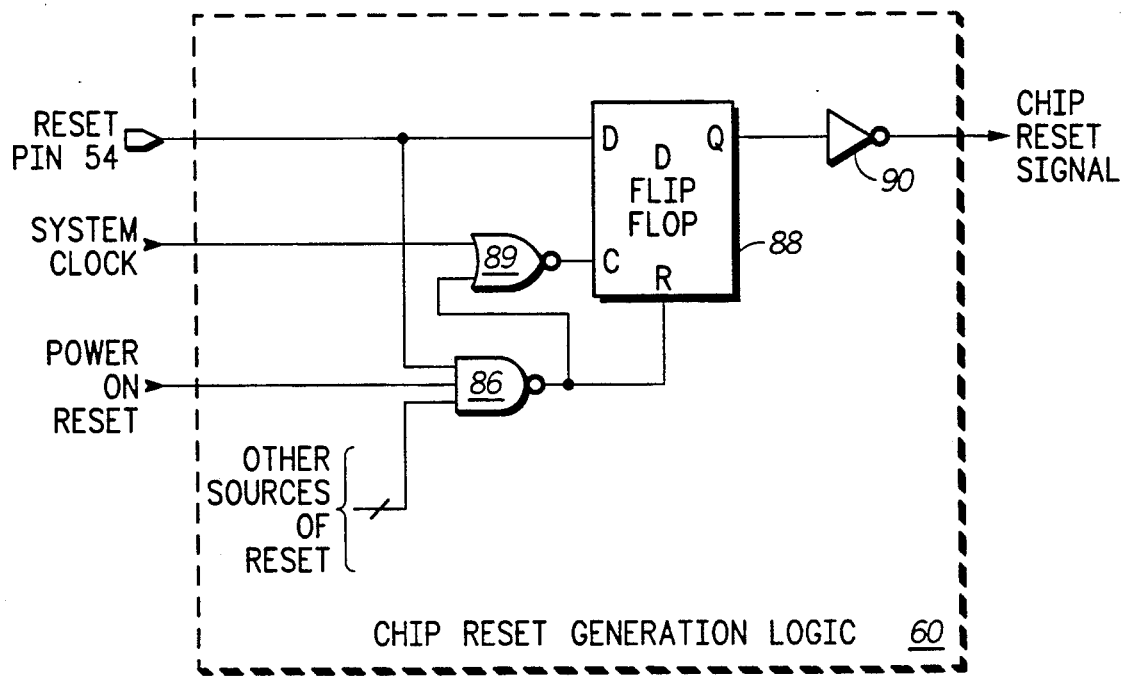
FIG. 6 illustrates, in logic diagram form, a chip reset generation logic circuit 60 of FIG. 3 in accordance with one embodiment of the present invention.

FIG. 6 illustrates a chip reset generation logic circuit 60. A NAND gate 86 receives a signal from reset pin 54 as an input. NAND gate 86 also receives a Power On Reset signal as an input. NAND gate 86 may also receive one or more input signals from other sources of reset. These other sources of reset may be generated internal or external to data processing system 40. The output of NAND gate 86 is connected to the reset input of D-flip-flop 88 and to an input of NOR gate 89. A System Clock signal is also connected to an input of NOR gate 89. The clock input of D-flip-flop 88 is connected to the output of NOR gate 89. The data input "D" of D-flip-flop 88 receives a signal from reset pin 54. The data output "Q" of D-flip-flop 88 is connected to inverter 90. The output of inverter 90 is a signal labeled Chip Reset.

Note that in the illustrated embodiment of the present invention, the positive power supply voltage "Power" applied at node 67 in FIG. 4 is also the positive power supply voltage which is used to power some or all of the circuitry within data processing system 40. When this positive power supply voltage is first applied, the voltage potential at all of the nodes receiving power transitions from approximately ground to approximately the potential of the positive power supply.

The operation of the prior art power on reset (POR) detection circuit 10 illustrated in FIG. 1 will now be described. The purpose of circuitry 23 is to generate a pulse which initializes cross-coupled NOR latch 31 and cross-coupled NOR latch 33. Transistor 12 serves the purpose of functioning as a capacitor. When no power is applied to circuitry 23, the voltage applied at node 13 is ground, or approximately zero volts. Thus there is no charge stored by transistor 12.

However, when power is applied to circuitry 23, the voltage at node 19 rises as the positive power supply voltage rises. If the voltage is ramped up quickly from zero volts when power is applied, then the voltage at node 19 will ramp up quickly also. When the positive power supply voltage reaches a voltage equal to approximately one transistor threshold voltage plus one diode drop voltage, then transmission gate 16 and diode 18 begin to conduct; and as a consequence, node 19 will drop to a voltage approximately one diode drop above ground.

When no power is applied to circuitry 23, the voltage at all nodes is approximately ground. When power is applied to circuitry 23, a voltage rise on node 19 that is above the switchpoint voltage of inverter 20 is sufficient to cause the output of inverter 20 to drive a logic level zero. However, as the voltage on node 19 drops to a voltage below the switchpoint of inverter 20, the output of inverter 20 changes state from a logic level zero to a logic level one. Thus the output of inverter 20 reacts to the quick ramp up of a positive power supply voltage by generating a negative pulse. As a result, inverter 22 generates a positive pulse which initializes cross-coupled NOR latch 31 and cross-coupled NOR latch 33.

Unfortunately, the prior art power on reset (POR) detection circuit 10 illustrated in FIG. 1 has three serious drawbacks. First, circuit 23 is unable to detect a power on condition when the rise time of the positive power supply voltage is very slow. For example, when a positive power supply voltage of 3 volts takes more than 1 second to increase from ground (~0 volts) to 3 volts, the voltage at node 19 may never be recognized as a logic level one by inverter 20. The reason is that diode 18 and transmission gate 16, which are conducting a small amount of current, will have sufficient time to bleed charge from node 19. Consequently, when the positive power supply voltage is ramped up very slowly, neither inverter 20 nor inverter 22 will generate a pulse to initialize cross-coupled NOR latches 31 and 33. Note that resistor 14 is used to remove residual charge remaining on the positive terminal of diode 18 when the positive power supply voltage is at or near the potential of ground.

The second drawback to the prior art power on reset (POR) detection circuit 10 illustrated in FIG. 1 is the DC current drawn by circuit 23. Although circuit 23 only draws a small amount of DC current (on the order of tens or hundreds of nanoamperes for some implementations), this amount of current may be a serious problem for some microcontrollers. For example, the microcontroller utilizing the present invention has a specification goal, when stopped, of 70 nanoamperes DC current for the entire microcontroller integrated circuit. Thus the DC current drawn by circuit 23 was a serious problem.

The prior art power on reset (POR) detection circuit 10 illustrated in FIG. 1 has two possible sources of DC current. The first source is the path from "Power" to ground through resistor 14 and diode 18. The second source is the path from power to ground in inverter 20 when a weak logic level is placed on node 19, the input to inverter 20.

The third drawback to the prior art power on reset (POR) detection circuit 10 illustrated in FIG. 1 is the fact that a large resistor 14 is required. Most currently used processes for manufacturing microcontrollers would use undoped polysilicon to implement a large resistor such as resistor 14. However, for microcontrollers which do not use undoped polysilicon in their manufacturing processes, resistor 14 would most likely be implemented using well diffusion, which requires a significant amount of semiconductor area.

Data processing system 40 thus required a reset logic circuit 48 which would respond more reliably to a wide range of positive power supply voltage rise times, which would not draw any DC current, and which would require fewer resistors.

The operation of the present invention will now be described. Referring to FIG. 3, the POR control circuit 56 is used to initiate an internal reset sequence which places the data processing system 40 into a reset state. In the present embodiment, POR control 56 is also used to trigger POR counter chain 58 which acts as a timing circuit. POR control 56 and POR counter chain 58 then hold the data processing system 40 in the reset state for a predetermined length of time. The data processing system 40 is held in the reset state in order to allow circuitry within data processing system 40 to initialize to a known state. For example, the crystal oscillator (not shown) is allowed to stabilize before the generated clocks signals are used to clock various circuits in data processing system 40.

Still referring to FIG. 3, the operation of the present invention will be described in more detail. When a positive power supply voltage is applied to POR control circuit 56, POR control 56 asserts both the Power On Reset signal and the Clear POR Counter signal. Referring to FIG. 6, the assertion of the Power On Reset signal causes the chip reset generation logic 60 to assert the Chip Reset Signal, thus placing or holding data processing system 40 in a reset state.

The assertion of the Clear POR Counter signal causes the POR counter chain 58 to reset its internal counter (not shown) to an initial counter value. Although the initial counter value is zero in the present embodiment, other embodiments may use an initial counter value equal to any value within the internal counter's range. Once the POR counter chain 58 has completed its initialization and reset its internal counter (not shown) to an initial counter value, the POR counter chain 58 asserts the POR Counter Cleared signal. The assertion of the POR Counter Cleared signal causes POR control 56 to negate the Clear POR Counter signal.

The negation of the Clear POR Counter signal causes the POR counter chain 58 to begin counting. The POR counter chain 58 counts by using the Oscillator Clock signal to either increment or decrement its internal counter (not shown). In the illustrated embodiment of the present invention, the Oscillator Clock signal is used to generate the System Clock signal. The Oscillator Clock signal may or may not come directly from a crystal oscillator. The Oscillator Clock signal operates even when the Power On Reset signal is asserted, whereas the System Clock signal does not begin to operate until the Power On Reset signal is negated. The POR counter chain 58 asserts the POR Sequence Finished signal when its internal counter (not shown) counts to a predetermined final counter value.

The assertion of the POR Sequence Finished signal causes POR control 56 to negate the Power On Reset signal. The negation of the Power On Reset signal brings data processing system 40 out of the reset state if the reset pin 54 is negated and if there are no other sources of reset asserted. Data processing system 40 remains in the reset state if either the reset pin 54 is asserted, or if one or more other sources of reset remain asserted.

Referring to FIG. 6, in the illustrated embodiment of the present invention there are several possible sources of reset that may cause data processing system 40 to be placed or remain in a reset state. When a signal from a source of reset is asserted, data processing system 40 is either placed in a reset state or remains in its existing reset state. Once data processing system 40 has been placed in a reset state, data processing system 40 only leaves the reset state when all possible sources of reset are negated. As long as a signal from any source of reset is asserted, data processing system 40 will remain in a reset state.

Because D-flip-flop 88 in the illustrated embodiment of the present invention has a synchronous reset input, NOR gate 89 is required in order to allow asynchronous assertion of the Chip Reset signal. In an alternate embodiment of the present invention, NOR gate 89 would not be required if D-flip-flop 88 had an asynchronous reset input.

In the illustrated embodiment of the present invention there are several possible sources of reset, each of which supplies a signal as an input to NAND gate 86. The first source of reset is the reset pin 54, which supplies a signal as an input to NAND gate 86. The second source of reset is POR control 56, illustrated in FIG. 3 and FIG. 4, which supplies the Power On Reset signal as an input to NAND gate 86. There are other sources of reset (not shown), each of which supplies a signal as an input to NAND gate 86. Note that other embodiments of the present invention may have more or different sources of reset than have been illustrated in FIG. 6. In fact, some embodiments may have the Power On Reset signal as the only source of reset.

Still referring to FIG. 6, when the Chip Reset signal is asserted, data processing system 40 is placed in a reset state and remains in the reset state until the Chip Reset signal is negated. When any one input to NAND gate 86 is asserted, the output of NAND gate 86 will assert the reset input of D-flip-flop 88. When the reset input of D-flip-flop 88 is asserted, the data output "Q" of D-flip-flop 88 is reset to a predetermined reset value. In the illustrated embodiment of the present invention, the predetermined reset value of the data output "Q" is a logic level zero.

Because the data output "Q" of D-flip-flop 88 is connected to an inverter 90 in the present embodiment, the asserted state of the Chip Reset signal at the output of inverter 90 is a logic level one. Other embodiments of the present invention may not use an inverter 90. Also, in other embodiments of the present invention, the output of NAND gate 86 could be used to assert a set input of D-flip-flop 88 so that the predetermined reset value of the data output "Q" would be a logic level one.

Referring now to FIG. 4, circuit 71 forces two nodes to always power up to the correct logic levels. Note that in the illustrated embodiment of the present invention, the positive power supply voltage "Power" applied at node 67 is positive ppositive power supply voltage which is used to power all of the circuitry in circuit 71. Node 63 will always power up to a logic level zero; and node 65 will always power up to a logic level one. In the embodiment of the present invention illustrated in FIG. 4, a logic level zero represents approximately the potential of ground and a logic level one represents approximately the potential of the positive power supply voltage applied at "Power".

Circuit 71 uses two different techniques to force nodes 63 and 65 to their desired logic levels. Capacitive voltage division is used primarily when a positive power supply voltage is first applied to the logic gates and to node 67 in FIG. 4. Logic gate switch point control is used primarily to reinforce the logic levels once the positive power supply voltage has risen to the point where the logic gates in FIG. 4 have begun to operate.

Capacitive voltage division is used by circuit 71 in order to establish initial conditions on nodes 63 and 65 when a positive power supply voltage is first applied. Using voltage division, the voltage at node 63 can be calculated using the following equation:

$$V63 = [Cp/(Cn+Cp+C70)]*Vsupply$$

where:
V63 is the voltage at node 63;
Cp is the parasitic capacitance from node 63 to the positive power supply;
Cn is the parasitic capacitance from node 63 to ground;
C70 is the capacitance of capacitor 70; and
Vsupply is the positive power supply voltage.

Using a capacitor 70 (C70) equal to 1.14 picofarads, and assuming that Cp and Cn are each approximately equal to 0.085 picofarads, then $V63 \sim (0.065*Vsupply)$. Thus V63 will be close to ground potential. Note that other capacitance values could be used as long as V63 stays sufficiently below the switchpoint of NOR gate 68.

Using voltage division, the voltage at node 65 can be calculated using the following equation:

$$V65 = [(Cp+C62)/(Cn+Cp+C62)]*Vsupply$$

where:
V65 is the voltage at node 65;
Cp is the parasitic capacitance from node 65 to the positive power supply;
Cn is the parasitic capacitance from node 65 to ground;
C62 is the capacitance of capacitor 62; and
Vsupply is the positive power supply voltage.

Using a capacitor 62 (C62) equal to 1.14 picofarads, and assuming that Cp and Cn are each approximately equal to 0.07 picofarads, then $V65 \sim (0.945*Vsupply)$. Thus V65 will be close to the voltage of the positive power supply. Note that other capacitance values could be used as long as V65 stays sufficiently above the switchpoint of NOR gate 64.

In a preferred embodiment, the logic gates utilized in circuit 71 and inverter 72 were implemented using enhancement mode MOSFET transistors (not shown). Also in the preferred embodiment, both capacitor 62 and capacitor 70 were implemented using an insulated gate field effect transistor (as shown in FIG. 5) which was an n-channel depletion mode MOSFET transistor. Both n-channel depletion mode MOSFET transistors had their bulk connections to ground. Capacitor 62, which is actually a transistor in the preferred embodiment, has both a first current electrode and a second current electrode connected to "Power" at node 67, and has a control electrode connected to node 65. Capacitor 70, which is actually a transistor in the preferred embodiment, has both a first current electrode and a second current electrode connected to ground, and has a control electrode connected to node 63. In other implementations, capacitors 62 and 70 could be implemented using any suitable device, such as for example, non-transistor capacitors.

The purpose of circuit 71 is to power up so that nodes 63 and 65 reach predetermined logic levels as quickly as possible and remain at these logic levels until the POR Counter Cleared signal is asserted. Circuit 71 will always power up with a voltage representing a logic level zero on node 63 and a voltage representing a logic level one on node 65. This is accomplished through the use of capacitive division and logic gate switch point control.

Circuit 71 does not have any of the drawbacks of the prior art POR detection circuit 10 of FIG. 1. Circuit 71 is able to detect a power on condition even when the rise time of the positive power supply voltage is very slow. Also, circuit 71 does not draw any DC current. In addition, the use of a large resistor is not required.

When power is first applied to circuit 71, Vsupply ramps up from approximately zero volts to its target operating voltage, which is approximately 3 volts in the illustrated embodiment of the present invention. Other embodiments of the present invention may use a different target operating voltage. Note that each logic gate in circuit 71 will not start to operate until its minimum operating voltage has been reached by the positive power supply voltage.

As illustrated by the preceding voltage division equations, when power is first applied and the logic gates in circuit 71 have not yet started to operate, nodes 63 and 65 will be closest in potential to their respective desired power up potentials. That is, the voltage at node 63 will be closest in potential to ground, and the voltage at node 65 will be closest in potential to the positive power supply voltage. Thus a voltage differential between node 63 and node 65 is immediately established when power is applied.

Once the positive power supply voltage has reached a minimum value, the logic gates in circuit 71 will begin to operate. Logic gate switch point control will then be used to ensure that NOR gates 64 and 68 drive the correct logic levels onto nodes 63 and 65. NOR gate 64 has a low switch point and NOR gate 68 has a high switch point. In the illustrated embodiment of the present invention, the low switch point of NOR gate 64 is approximately equal to one third the target operating voltage; and the high switch point of NOR gate 68 is approximately equal to two thirds the target operating voltage.

Other embodiments may use different switch points for NOR gates 64 and 68, as long as: (1) the voltage at node 63 stays sufficiently below the high switch point of NOR gate 68; and (2) as long as the voltage at node 65 stays sufficiently above the low switch point of NOR gate 64. If these two conditions are met, NOR gates 64 and 68 will drive the desired logic levels onto nodes 63 and 65 when they are operating. Thus, the logic gate switch points chosen for NOR gates 64 and 68 cause node 63 to remain at the desired logic level zero and cause node 65 to remain at the desired logic level one.

The purpose of circuit 71 is to power up so that node 63 reaches and remains at a logic level zero as quickly as possible, and so that node 65 reaches and remains at a logic level one as quickly as possible. Thus when power is applied, inverter 72 will always have a logic level one as its input at node 65. In other words, by the time that the positive power supply voltage has reached a minimum value where inverter 72 has begun to operate, the input to inverter 72 will be a logic level one. Consequently, the output of inverter 72 will be a logic level zero; and the output of inverter 74 will be a logic level one.

Note that a logic level one on any set input of either SR-latch 81 or SR-latch 83 is sufficient to ensure that the output "Q" of that latch is a logic level one. The set input of SR-latch 81 is connected to the output of inverter 74. One of the set inputs of SR-latch 83 is also connected to the output of inverter 74. Thus, SR-latches 81 and 83 will both always power up in a known state with an output "Q" equal to a logic level one. Thus the Power On Reset Signal will always be asserted when power is first applied to circuit 71. The Power On Reset signal will remain asserted until the POR Counter Cleared signal is asserted.

When the POR Counter Cleared signal is asserted, NOR gate 68 changes state and drives a logic level zero onto node 65. NOR gate 64 then changes state and drives a logic level one onto node 63. Node 65 will then remain at a logic level zero until power is removed and then applied again. After NOR gate 68 changes state and drives a logic level zero onto node 65, the output of inverter 72 changes state to a logic level one and the output of inverter 74 changes state to a logic level zero. With its set input at a logic level zero and its reset input at a logic level one, the output "Q" of SR-latch 81 is a logic level zero. Both set inputs to SR-latch 83 are now a logic level zero, and the reset input remains a logic level zero as long as the POR Sequence Finished signal is negated.

As a result, the Power On Reset signal remains asserted until the POR Sequence Finished signal is asserted. When the POR Sequence Finished signal is asserted, the reset input of SR-latch 83 becomes a logic level one and the output "Q" of SR-latch 83 becomes a logic level zero. Consequently, the Power On Reset signal is negated. Note that the Clear POR Counter Signal is asserted when either node 65 is a logic level one or the STOP signal is a logic level zero. The Clear POR Counter Signal is negated when both node 65 is a logic level zero and the STOP signal is a logic level one. The STOP signal is a logic level zero when data processing system 40 is in a stop mode.

In summation, the above specification describes a method and apparatus for performing power on reset initialization in a data processing system 40. The present invention allows a particular node, node 65, to always power up to a predetermined logic level. The predetermined logic level of this node can then be used to assert a Power On Reset signal. When a predetermined power up time delay has expired, the node can then be forced to the opposite state in order to negate the Power On Reset signal.

While the present invention has been illustrated and described with reference to specific embodiments, further modifications and improvements will occur to those skilled in the art. For example, various circuits could be used to implement POR control 56, POR counter chain 58, and chip reset generation logic 60.

Other embodiments of the present invention may use other types of inverting logic gates in place of NOR gates 64 and 68, and inverters 72 and 74 in FIG. 4. Also, other types of latches may be used in place of SR-latches 81 and 83. Other embodiments may use a different number of inversions between node 65 and the input to SR-latches 81 and 83. Other embodiments may not require SR-latch 81 because circuit 71 also serves the function of a latch, unlike circuit 23 in the prior art FIG. 1

It is to be understood, therefore, that this invention is not limited to the particular forms illustrated and that it is intended in the appended claims to cover all modifications that do not depart from the spirit and scope of this invention.

We claim:

1. A circuit for performing power on reset initialization in a data processing system, comprising:
    a power on detection circuit, receiving a feedback input signal and providing a control output signal, the control output signal always being asserted after power is applied to said power on detection circuit, the control output signal remaining asserted until the feedback input signal is asserted;

circuit means, coupled to said power on detection circuit, for receiving the control output signal, for receiving said feedback input signal, and for asserting a power on reset signal when the control output signal is asserted, and for asserting an initialization signal when the control output signal is asserted; and counter circuitry, coupled to said power on detection circuit and to said circuit means, said counter circuitry being initialized in response to assertion of the initialization signal, said counter circuitry asserting the feedback input signal when initialization of said counter circuitry is complete, and said counter circuitry beginning to count in response to negation of the initialization signal.

2. A circuit as in claim 1, further comprising:
a reset generation circuit, coupled to said power on detection circuit, said reset generation circuit receiving the power on reset signal and asserting a global reset signal which causes the data processing system to be reset.

3. A circuit as in claim 1, wherein said power on detection circuit comprises:
a first capacitive means for storing charge, having a first electrode coupled to the control output signal and having a second electrode coupled to a first terminal for receiving a first voltage;
a second capacitive means for storing charge, having a first electrode coupled to a second node and having a second electrode coupled to a second terminal for receiving a second voltage;
a first inverting logic gate, having a first input coupled to the control output signal and having an output coupled to the second node; and
a second inverting logic gate, having a first input coupled to the second node, having a second input coupled to receive the feedback input signal, and having an output coupled to the control output signal.

4. A circuit as in claim 3, wherein the first capacitive means is a first insulated gate field effect transistor.

5. A circuit as in claim 4, wherein the second capacitive means is a second insulated gale field effect transistor.

6. A circuit as in claim 5, wherein the first inverting logic gate has a second input coupled to the second terminal for receiving the second voltage, and wherein the first inverting logic gate is a first NOR gate.

7. A circuit as in claim 6, wherein the second inverting logic gate is a second NOR gate.

8. A circuit as in claim 1, wherein the first voltage is at a higher potential than the second voltage.

9. A circuit as in claim 1, wherein said circuit means comprises:
a plurality of serially coupled inverters, a first one of said plurality of serially coupled inverters receiving the control output signal, a last one of said plurality of serially coupled inverters having an output;
a first SR-latch, having a first input which is coupled to the output of the last one of said plurality of serially coupled inverters, and having a second input which is coupled to said power on detection circuit; and a second SR-latch, coupled to said first SR-latch, said second SR-latch providing the power on reset signal as an output.

10. A circuit for performing power on reset initialization in a data processing system, comprising:
a first capacitive means for storing charge, having a first electrode coupled to a first node, and having a second electrode coupled to a first terminal for receiving a first voltage;
a second capacitive means for storing charge, having a first electrode coupled to a second node, and having a second electrode coupled to a second terminal for receiving a second voltage;
a first inverting logic gate, having a first input coupled to the first node, and having an output coupled to the second node;
a second inverting logic gate, having a first input coupled to the second node, having a second input coupled to receive a feedback input signal, and having an output coupled to the first node for providing a control output signal;
circuit means, having an input coupled to the first node for receiving the control output signal, said circuit means generating a power on reset signal and generating an initialization signal; and
counter circuitry, coupled to said circuit means and to the second input of said second inverting logic gate, said counter circuitry being initialized in response to assertion of the initialization signal, said counter circuitry asserting the feedback signal when initialization of said counter circuitry is complete, and said counter circuitry beginning to count in response to negation of the initialization signal.

11. A circuit as in claim 10, further comprising:
a reset integrated circuit pin; and
a reset generation circuit, coupled to said circuit means and to said reset integrated circuit pin, said reset generation circuit receiving the power on reset signal from said circuit means and receiving a pin reset signal from said reset integrated circuit pin, said reset generation circuit asserting a global reset signal which causes the data processing system to be reset.

12. A data processing system as in claim 10, wherein the first capacitive means is a first n-channel depletion mode MOSFET transistor.

13. A data processing system as in claim 12, wherein the second capacitive means is a second n-channel depletion mode MOSFET transistor.

14. A data processing system as in claim 13, wherein the first inverting logic gate is a first NOR gate.

15. A data processing system as in claim 14, wherein the second inverting logic gate is a second NOR gate.

16. A circuit as in claim 10, wherein the first voltage is at a higher potential than the second voltage.

17. A circuit as in claim 10, wherein said circuit means comprises:
a plurality of serially coupled inverters, a first one of said plurality of serially coupled inverters being coupled to the first node, a last one of said plurality of serially coupled inverters having an output;
a first SR-latch, having a first input which is coupled to the output of the last one of said plurality of serially coupled inverters, and having a second input which is coupled to the second node; and
a second SR-latch, coupled to said first SR-latch, said second SR-latch providing the power on reset signal as an output.

18. A circuit as in claim 17, wherein said first SR-latch comprises:
   a first NOR gate having an input and having an output; and
   a second NOR gate, having an input which is coupled to the output of said first NOR gate, and having an output which is coupled to the input of said first NOR gate.

19. A method for performing a power on reset initialization in a data processing system, comprising the steps of:
   receiving a power supply voltage;
   initially establishing a first logic level on a first node and a second logic level on a second node using capacitive voltage division;
   reinforcing the first logic level on the first node and the second logic level on the second node using logic gate switch point control;
   providing the first logic level to a first circuit;
   in response to the first circuit receiving the first logic level, asserting and outputting a power on reset signal from the first circuit;
   in response to the first circuit receiving the first logic level, asserting and outputting an initialization signal from the first circuit;
   in response to assertion of the initialization signal, performing initialization of a counter circuit;
   in response to completion of the initialization of the counter circuit, asserting an initialization complete signal; and
   in response to assertion of the initialization complete signal, removing the first logic level from the first node.

20. A method as in claim 19, further comprising the step of: resetting the data processing system.

* * * * *